United States Patent [19]
Terrill et al.

[11] Patent Number: 5,073,721
[45] Date of Patent: Dec. 17, 1991

[54] NOISE IMMUNE POWER SWITCH FOR AUTOMOTIVE ACCESSORIES

[75] Inventors: Lawrence Terrill, Bloomington; Francis L. Carr, Downers Grove, both of Ill.

[73] Assignee: Safco Corporation, Chicago, Ill.

[21] Appl. No.: 512,974

[22] Filed: Apr. 23, 1990

[51] Int. Cl.$^5$ .............................................. H02H 7/18
[52] U.S. Cl. .................................. 307/10.7; 307/10.1; 307/116; 322/99; 322/DIG. 6
[58] Field of Search ...................... 307/9.1, 10.1, 10.7, 307/10.8, 38, 39, 47, 67, 68, 76, 84, 308, 116, 125, 129, 130; 361/170, 187, 182; 322/58, 99, 100, DIG. 6; 324/158 MG, 545, 546; 340/438; 364/424.05

[56] References Cited

U.S. PATENT DOCUMENTS

| | | | |
|---|---|---|---|
| 3,492,559 | 1/1970 | Harris | 320/48 |
| 4,209,816 | 6/1980 | Hansen | 361/23 |
| 4,493,001 | 1/1985 | Sheldrake | 361/92 |
| 4,733,100 | 3/1988 | Nusairat et al. | 307/9.1 |

*Primary Examiner*—A. D. Pellinen
*Assistant Examiner*—David Osborn
*Attorney, Agent, or Firm*—Gerald M. Newman

[57] ABSTRACT

A noise immune electronic switch is connectible between a cigarette lighter socket of a vehicle and a plug-in accessory device. The electronic switch is turned on in response to the drop in B+ voltage at the lighter socket when the automobile starter is engaged for rapidly charging an integrating capacitor that is coupled to a comparator. The other comparator input is connected to a source of reference voltage. The output of the comparator, when switched, drives a transistor switch conductive to couple the B+ line between the cigarette lighter socket and an output connector. A filter passes alternator ripple voltage on the B+ line to an amplifier where the ripple is amplified and inverted. The negative half cycles of the ripple voltage charge the integrating capacitor to maintain the comparator output switched. A defeat diode is connected between the integrating capacitor and the output connector such that the capacitor cannot charge when the transistor switch is nonconductive and an accessory device is connected to the output connector. A turn-on transistor is coupled between the storage capacitor and the integrating capacitor and is turned on by the sharp drop in voltage on the B+ line when the automobile starter motor is engaged.

6 Claims, 2 Drawing Sheets

NOISE IMMUNE POWER SWITCH FOR AUTOMOTIVE ACCESSORIES

BACKGROUND OF THE INVENTION AND PRIOR ART

This invention relates in general to power switches for connecting accessory devices, such as cellular telephones, to automobile charging circuits via the vehicle cigarette lighter socket.

U.S. Pat. No. 4,733,100 discloses an automatic on/off switch circuit with time delay for powering a radar warning receiver or the like from the cigarette lighter socket of an automobile. The switch is placed in its on condition to electrically connect the radar detector to the automobile charging circuit in response to the electrical noise produced when the automobile engine is running. The switch circuit integrates the noise signals to drive a switching transistor conductive. A predetermined time after shut down of the automobile engine (and disappearance of the noise signals), the switch reverts to its off condition and disconnects the radar detector.

The patented circuit responds to a wide range of noise signals and can be made to respond to noise signals other than those produced by a running engine, e.g. an automobile fan or a clock. Noise generated by devices requiring relatively large currents, such as CB radios or cellular telephones, can be sufficient to cause the patented circuit to falsely trigger in an oscillatory manner, which could result in the automobile battery being discharged. It should be noted that the patented circuit is intended for incorporation into the radar detector proper and therefore only needs to discriminate against a limited range of signals and noises, i.e. those produced by the radar detector (or other particular product).

The present invention contemplates a stand alone switch intended for use with a wide variety of both small and large current accessory devices. Special care is taken to assure that the electronic switch is not falsely triggered by signals and noise produced by any of the types of apparatus with which the switch will be used. The inventive electronic switch is only turned on in response to a sharp drop in B+ voltage, corresponding to energization of the vehicle starter motor, and is maintained in an on condition if a unique signal from the alternator is received within a predetermined time after the turn-on transistor has initiated switch operation. When the automobile engine is turned off, the electronic switch resets after a predetermined time and cannot be reinitiated except by the turn-on transistor. The unique alternator signal that maintains the electronic switch in the on state is the negative half of the alternator ripple voltage. This signal is unique and differs from any other signal present in the automobile environment or in the accessories that would be operated from the switch.

OBJECTS OF THE INVENTION

A principal object of the invention is to provide a novel electronic power switch for operating an accessory from an automobile cigarette lighter socket.

Another object of the invention is to provide an improved accessory switch for use with an automobile battery circuit.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
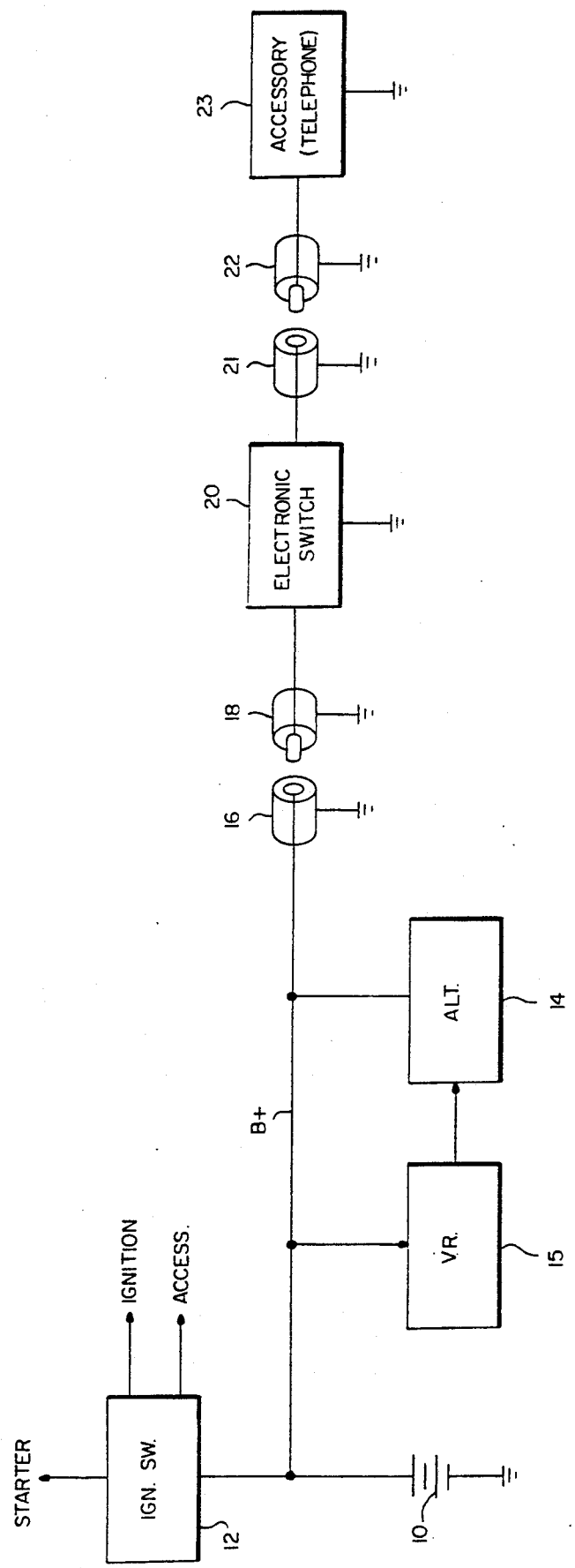
FIG. 1 is a simplified block diagram of an automobile power supply system and the switch of the invention.

Referring to FIG. 1, an automobile battery 10 is connected to an ignition switch 12 which in turn supplies a starter, an ignition circuit and an accessory circuit (all not shown) of conventional construction in an automobile. The positive (B+) terminal of battery 10 is also connected in a conventional charging circuit with an alternator 14 and a voltage regulator means 15. A direct connection exists from the positive terminal of battery 10 to a cigarette lighter socket 16 mounted in the dashboard of a vehicle (not shown). A mating plug 18, engageable with lighter socket 16, provides a B+ input connection to an electronic switch 20 which has an output connector in the form of another cigarette lighter socket 21. A mating plug 22 on an accessory device 23 connects to socket 21. Accessory device 23 may be a cellular telephone, a CB radio or any other suitable utilization device.

Under normal operating conditions and with the automobile engine not running, the B+ DC voltage of the battery appears at socket 16 because of its direct connection to battery 10. When the engine is running, alternator 14 produces a higher multiphase alternating current voltage that is rectified and supplied as charging current for the battery 10 and to operate the ignition and accessory circuits. The B+ line carries the rectified alternator voltage and a small ripple voltage. Any electrical noise, emitted by operation of the engine (ignition noise) or received from other sources will also be on the B+ line and hence appear at socket 16. Consequently, the input to electronic switch 20 may include a DC voltage, an alternator ripple voltage, ignition noise voltage and other types of noise voltages.

Figure 2:
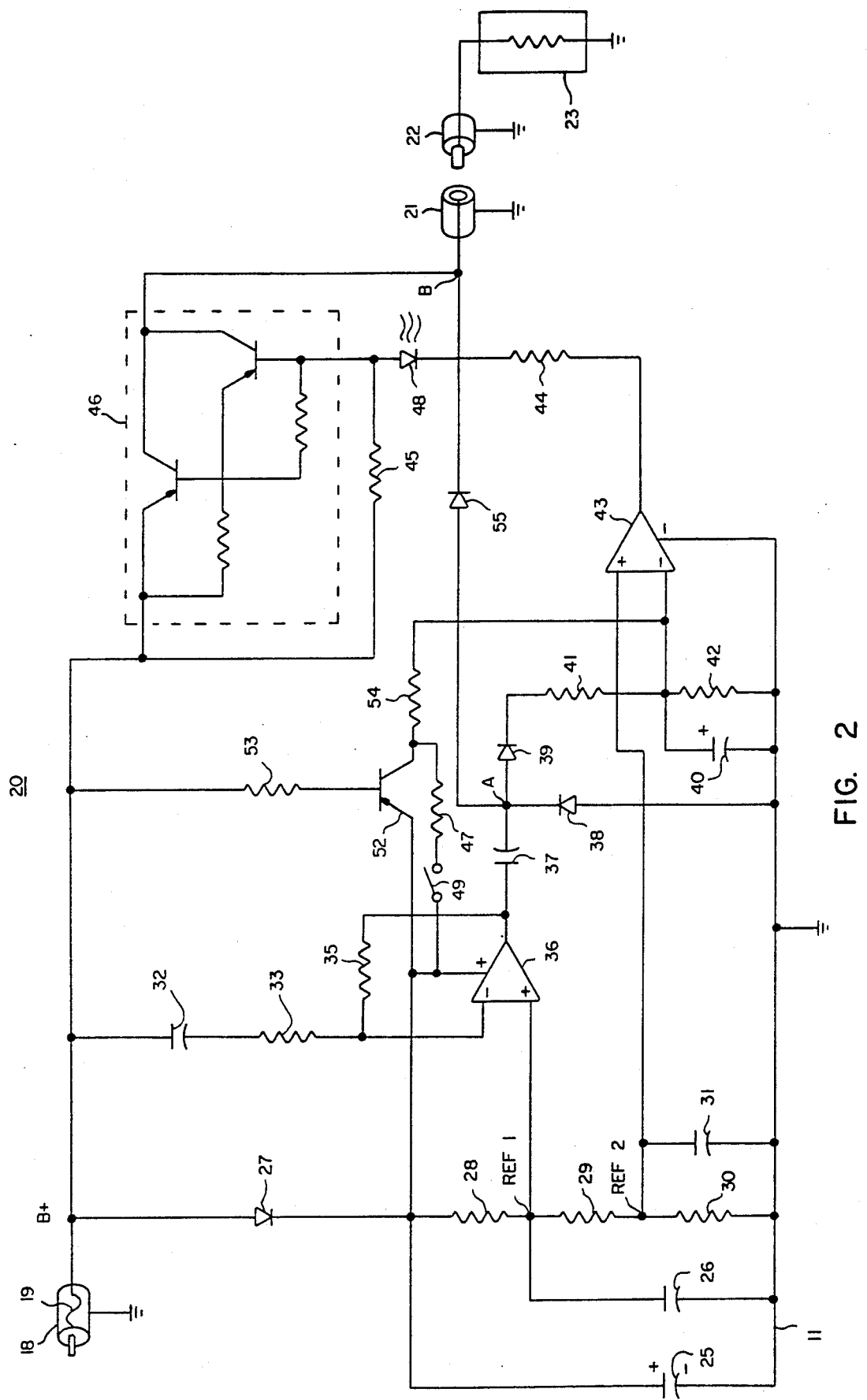
FIG. 2 is a schematic diagram of the switch of the invention.

Referring to FIG. 2, electronic switch 20 includes an input plug 18, which is connected to socket 16. A protective fuse 19 is connected in series with the B+ line. Output socket 21 of switch 20 is connected to a terminal B which is connectible to the B+ line via the emitter-collector path of a transistor switch 46. Socket 21 and plug 19 both have one side or terminal connected to ground. A similar plug 22 is connectible to socket 21 for connecting an accessory load 23, such as a cellular telephone, to battery 10 through electronic switch 20.

The B+ lead is connected through a diode 27 to a voltage divider consisting of resistors 28, 29 and 30 connected in series to ground. The cathode of diode 27 is connected to a large filter or storage capacitor 25 and the junctions of resistors 28 and 29 and of resistors 29 and 30 are connected to ground through bypass capacitors 26 and 31, respectively. The junction of resistors 28 and 29 develops a reference voltage (indicated as REF 1) and the junction of resistors 29 and 30 develops another reference voltage (indicated as REF 2). REF 1 is connected to the positive or non-inverting terminal of an operational amplifier 36 and REF 2 is connected to positive terminal of an operational amplifier 43. The negative or inverting terminal of operational amplifier 36 is connected to B+ through a filter consisting of a capacitor 32 and a resistor 33 connected in series. The output of operational amplifier 36 is returned to its negative input terminal by means of a feedback resistor 35. The output of operational amplifier 36 is coupled through a capacitor 37 to a junction A of three diodes 38, 39 and 55. Diode 38 has its anode connected to ground and its cathode connected to junction A and diode 39 has its anode connected to junction A and its cathode connected to a voltage divider consisting of resistors 41 and 42 connected to ground. The junction of resistors 41 and 42 is connected to ground through an integrating capacitor 40 and is also connected to the negative input of operational amplifier 43. The anode of diode 55, which is referred to as a defeat diode, is connected to junction A and its cathode is connected to output terminal B. As mentioned, transistorized switch arrangement 46 bridges the B+ line and output terminal B. A resistor 45 is connected from B+ to the input of transistor switch 46 and to the output of operational amplifier 43 through an LED 48 and a resistor 44. When transistor switch 46 is supplied with base current (turned ON), LED 48 will be lighted.

A turn-on transistor 52 has its emitter-collector path connected between the positive terminal of filter capacitor 25 and the positive terminal of integrating capacitor 40. A small resistor 54 is included in the circuit to limit current flow. The base of turn-on transistor 52 is connected to B+ through a resistor 53. A manual switch 49 and a series resistor 47 are connected across the emitter-collector path of turn-on transistor 52. Under normal operating conditions, the battery voltage is approximately 12.6 volts DC (without the alternator operating) and the REF 2 voltage applied to the positive input of operational amplifier 43 is about 0.25 volts. In the absence of charge on integrating capacitor 40, the output of operational amplifier 43 is positive, transistor switch 46 is cut off and there is no connection from B+ to output terminal B. Integrating capacitor 40 is approximately one tenth the size of storage capacitor 25 (about 3.3 microfarads vs. 33 microfarads). Storage capacitor 25 is charged to a potential equal to B+ minus the voltage drop across diode 27.

Turn-on transistor 52 is normally off. Responsive to a negative-going voltage edge on the B+ line, such as that caused by energization of the starter motor circuit, diode 27 is reverse biased and turns on transistor 52, which is driven into heavy current saturation, since its base is driven negative with respect to its emitter which is held at the potential existing across filter capacitor 25. Conduction of turn-on transistor 52 results in a rapid transfer of energy from filter capacitor 25 to integrating capacitor 40. This instantaneously raises the potential at the negative input of operational amplifier causing the output of operational amplifier 43 to go negative and turn-on transistor switch 46 through LED 48, which is illuminated to indicate that transistor switch 46 is ON. Transistor switch 46, in turning on, connects the B+ line to the output terminal B and energizes the connected load 23.

Turn on transistor 52 turns off when its base-emitter junction is no longer forward biased and integrating capacitor 40 begins to discharge through resistor 42. Unless capacitor 40 has its charge replenished, its terminal voltage will drop below the REF 2 potential at the positive terminal of operational amplifier 43 and operational amplifier 43 will revert to its positive output voltage and cut off transistor switch 46 and LED 48.

Assuming that the engine is running and that an alternator ripple voltage appears on the B+ line, the frequency of that ripple voltage is such that the signal is passed by the filter amplifier (capacitor 32 and resistor 33) to the negative input of operational amplifier 36. The ripple voltage is amplified by operational amplifier 36 which produces an output signal. This output signal consists of the amplified and inverted alternator ripple voltage riding on a DC voltage level. When the output voltage of amplifier 36 is positive going, capacitor 37 is charged and diode 39 is forward biased to charge integrating capacitor 40. When the output voltage of amplifier 36 is negative going, capacitor 37 discharges through. diode 38 which becomes forward biased. (Capacitor 40 discharges through resistor 42 during this period.) The net effect is to maintain a sufficient charge on capacitor 40 to keep the negative input of amplifier 43 at a greater potential than the REF 2 voltage at its positive input. When this condition occurs, the output of operational amplifier 43 remains negative and maintains transistor switch 46 conductive and LED 48 illuminated.

As mentioned, should the alternator ripple voltage not appear on the B+ line to supply sufficient charge to integrating capacitor 40, capacitor 40 will discharge through resistor 42. The output of operational amplifier 43 will switch to positive, LED 48 will be extinguished and transistor switch 46 will open to disconnect B+ from output terminal B. This, of course, occurs when the automobile engine is turned off.

Protection against inadvertent operation of electronic switch 20 is provided by defeat diode 55 which connects junction A to output terminal B. With a connected load, such as load 23, supplying a resistance connection to ground across output terminal B, and with transistor switch 46 open, positive potential buildup at terminal A will be inhibited. This is because defeat diode 55 will conduct current through the connected load resistance as soon as the positive potential exceeds the breakdown voltage of defeat diode 55. With terminal A being effectively coupled to ground, there is no possibility of integrating capacitor 40 achieving a sufficient charge to enable conduction of transistor switch 46. When turn-on transistor 52 operates however, integrating capacitor 40 is immediately charged through the alternate path from filter capacitor 25 to turn transistor switch 46 on. When this occurs, terminal B goes to B+ potential, which back biases defeat diode 55 and permits the potential at terminal A to follow the output signals from operational amplifier 36.

Manual switch 49 is not involved with the invention and is normally in the open position. When switch 49 is closed, it connects resistor 47 between the emitter and collector of turn-on transistor 52, which simulates a continuous motor starting condition that turns on LED 48 and transistor switch 46.

Thus the circuit of the invention not only is capable of switching on relatively large current accessory devices when the ignition key of the automobile is turned to the start position, and of switching them off when the engine is shut down, it is protected from inadvertent turn on by extraneous noise signals and by signals that may be generated by the accessory devices themselves. This is achieved with a turn-on circuit which responds only to a negative-going edge on the B+ line to initiate the transistor switch operation. A unique signal must be received shortly thereafter to maintain the transistor switch in its on state. This unique signal (to the automotive environment) consists of the negative portions of the alternator ripple voltage.

What has been described is a novel electronic switch for use in connecting accessories to the cigarette lighter socket of an automobile. It is recognized that numerous changes and modifications in the described embodiment of the invention will be apparent to those skilled in the art without departing from its true spirit and scope. The invention is to be limited only as defined in the claims.

What is claimed is:

1. A noise immune electronic switch for powering a utilization device from the cigarette lighter socket of an automotive vehicle having a storage battery, a starter motor and an engine driven alternator system that, during operation, develops an AC ripple voltage having a frequency within a limited frequency range at said lighter socket, comprising:

an input connector adapted to mechanically and electrically engage said lighter socket;

an output connector adapted for electrical connection to an accessory device;

filter means coupled to said input connector for passing signals within said limited frequency range;

amplifying means coupled to said filter means for amplifying said signals;

switch means connected between said input connector and said output connector;

integration means for driving said switch means conductive responsive to a predetermined output from said amplifying means;

defeat means for nullifying said integration means when an accessory is connected to said output connector; and turn-on means responsive to a particular signal at said lighter socket for overriding said defeat means to enable said switch means.

2. The apparatus of claim 1 wherein said integration means is supplied with energy on negative half cycles of said AC ripple voltage only.

3. The apparatus of claim 2, further including a source of reference voltage and wherein said integration means includes a comparator having one input supplied with said reference voltage.

4. The apparatus of claim 3, further including a large storage capacitor and wherein said turn-on means includes a transistor having its conduction circuit connected between said storage capacitor and said integration means.

5. The apparatus of claim 4 wherein said defeating means comprises a diode coupled between said integration means and said output connector.

6. A noise immune electronic switch for powering an accessory device from the cigarette lighter socket of an automotive vehicle having a storage battery, a starter motor and an engine driven alternator that develops an AC ripple voltage having a frequency within a limited frequency range at said lighter socket comprising:

an input connector for making electrical contact with said lighter socket;

an output connector for electrically connecting said accessory device;

filter means coupled to said input connector for passing said AC ripple voltage;

amplifier means coupled to said filter means for amplifying and inverting said AC ripple voltage;

normally non-conductive transistor switch means connected between said input connector and said output connector;

integration means including an integrating capacitor for developing a voltage responsive to the negative half cycles of said AC ripple voltage from said amplifying means;

means for developing a reference potential;

comparator means in said integration means having one input supplied with said reference voltage and another input coupled to said integrating capacitor;

means connecting the output of said comparator means to said transistor switch means for operating said transistor switch means;

diode means for preventing charging of said integrating capacitor by said AC ripple voltage when said transistor switch means is non-conductive and an accessory device is connected to said output socket;

a storage capacitor for storing energy; and a turn-on transistor coupled between said storage capacitor and said comparator means for rapidly charging said integrating capacitor and activating said comparator means to operate said transistor switch means in response to a rapid drop in voltage at said input connector upon energization of said starter motor.

* * * * *